(12) United States Patent
Lai et al.

(10) Patent No.: US 9,583,536 B2
(45) Date of Patent: Feb. 28, 2017

(54) MEMORY DEVICE AND METHOD FOR MANUFACTURING THE SAME

(71) Applicant: MACRONIX INTERNATIONAL CO., LTD., Hsinchu (TW)

(72) Inventors: Erh-Kun Lai, Taichung (TW); Chao-I Wu, Hsinchu (TW); Yu-Hsuan Lin, Taichung (TW); Dai-Ying Lee, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/806,832

(22) Filed: Jul. 23, 2015

(65) Prior Publication Data
US 2017/0025473 A1    Jan. 26, 2017

(51) Int. Cl.
H01L 47/00 (2006.01)
H01L 27/24 (2006.01)
H01L 45/00 (2006.01)

(52) U.S. Cl.
CPC ...... *H01L 27/2409* (2013.01); *H01L 45/1233* (2013.01); *H01L 45/1253* (2013.01); *H01L 45/145* (2013.01); *H01L 45/1616* (2013.01); *H01L 45/1625* (2013.01); *H01L 45/1641* (2013.01); *H01L 45/1691* (2013.01)

(58) Field of Classification Search
CPC ............. H01L 29/66825; H01L 29/788; H01L 29/42324; H01L 29/66833
USPC ...................... 257/1, 315; 438/211
See application file for complete search history.

(56) References Cited

U.S. PATENT DOCUMENTS

| 8,735,863 B2 | 5/2014 | Fowler et al. | |
| 8,828,786 B2 | 9/2014 | Miyazaki et al. | |
| 2002/0182798 A1* | 12/2002 | Saito | H01L 28/40 438/211 |
| 2013/0292627 A1* | 11/2013 | Sonehara | H01L 27/224 257/2 |

OTHER PUBLICATIONS

Lin, et al.: "A Fab-Compatible Tungsten Silicide RRAM with PVD TiN Top Electrode for Demonstrating Unipolar Operation"; Macronix International Co., Ltd., Emerging Central Lab, 16 Li-Hsin Road, Hsinchu Science Park, Taiwan.
TIPO Office Action dated Oct. 18, 2016 in Taiwan application (No. 104124176).

* cited by examiner

*Primary Examiner* — Theresa T Doan
(74) *Attorney, Agent, or Firm* — McClure, Qualey & Rodack, LLP (57) ABSTRACT

A memory device having an array area and a periphery area is provided. The memory device includes a substrate, an isolation layer formed in the substrate, a first doped region formed on the isolation layer in the array area, a second doped region formed on the first doped region, a metal silicide layer formed on the second doped region, and a metal silicide oxide layer formed on the metal silicide layer.

11 Claims, 11 Drawing Sheets

MEMORY DEVICE AND METHOD FOR MANUFACTURING THE SAME

TECHNICAL FIELD

The disclosure relates in general to a memory device and a method for manufacturing the same, and more particularly to a unipolar resistive random-access memory device and a method for manufacturing the same.

BACKGROUND

As a candidate for nonvolatile memory applications of next generation, resistive random-access memory (RRAM) attracts abundant attention due to its simple metal-insulator-metal structure, excellent scalability, fast switching speed, low-voltage operation and good compatibility with CMOS technology. Two common resistance switch modes for resistive random-access memory include bipolar and unipolar operations.

However, bipolar operation may cause area consumption. Further, general resistive random-access memory includes planar MOS selectors which may also cause area consumption.

Therefore, the unipolar operation is more attractive since ideally $4F^2$ cell size can be integrated in one-diode-one-resistor (1D1R) array for high density application. Several kinds of unipolar RRAM materials, such as $WO_x$, $HfO_2$ and $Ta_2O_x$, have been studied. The silicide based materials also catch the attention due to their great integration compatibility with CMOS technology.

SUMMARY

The disclosure is directed to a unipolar memory device with PVD TiN/WSixOy/W-silicide/polysilicide structure and method for manufacturing the same. Further, the memory device in the disclosure may include vertical diodes as selectors which are more than planar MOS selectors.

According to one embodiment, a memory device having an array area and a periphery area is provided. The memory device includes a substrate, an isolation layer formed in the substrate, a first doped region formed on the isolation layer in the array area, a second doped region formed on the first doped region, a metal silicide layer formed on the second doped region, and a metal silicide oxide layer formed on the metal silicide layer.

According to another embodiment, a method for manufacturing a memory device is provided. The method includes the following steps. A substrate is provided. A polysilicide layer is deposited on the substrate. A photoresist layer is formed on the polysilicide layer to define an array area and a periphery area. A first doped region is formed at a bottom portion of the polysilicide layer in the array area. A second doped region is formed at a top portion of the polysilicide layer and an undoped region between the first doped region and the second doped region in the array area. A metal silicide layer is deposited on the polysilicide layer. The metal silicide layer, the first doped region and the undoped region of the polysilicide layer in the array area are patterned to form a plurality of holes. Spacers are formed in the holes. A metal silicide oxide layer is formed on the metal silicide layer in the array area.

BRIEF DESCRIPTION OF THE DRAWINGS

FIG. 2A to FIG. 2M illustrate a process for manufacturing the memory device in one embodiment according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and there may be other embodiments of the present disclosure which are not specifically illustrated. Thus, the specification and the drawings are regarded as an illustrative sense rather than a restrictive sense.

Figure 1:
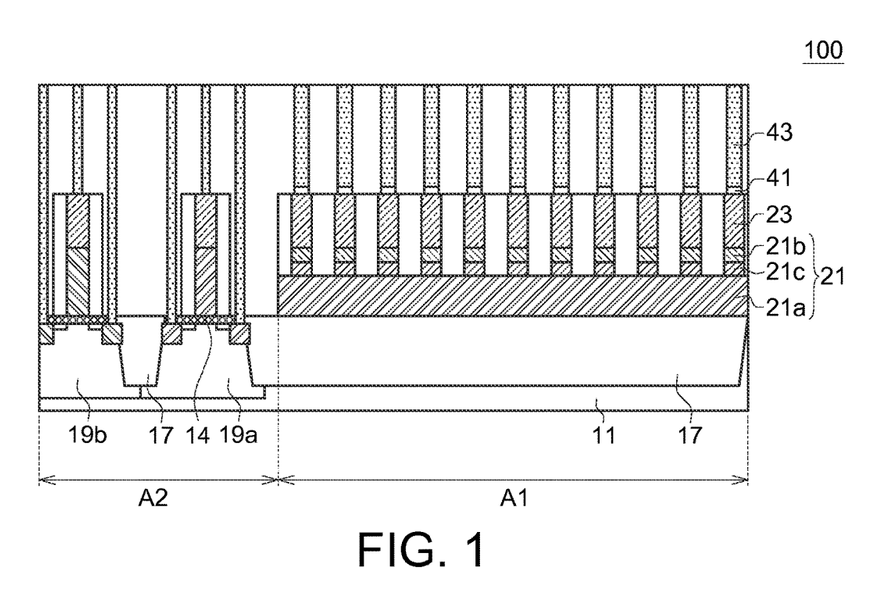
FIG. 1 illustrates a cross-section view of the memory device in one embodiment according to the disclosure.

FIG. 1 illustrates a cross-section view of the memory device 100 in one embodiment according to the disclosure. In the embodiment, the memory device 100 may have an array area A1 and a periphery area A2. As shown in FIG. 1, the memory device 100 may include a substrate 11, an isolation layer 17 formed in the substrate 11, a first doped region 21a formed on the isolation layer 17 in the array area A1, a second doped region 21b formed on the first doped region 21a, a metal silicide layer 23 formed on the second doped region 21b, and a metal silicide oxide layer 41 formed on the metal silicide layer 23.

In this embodiment, the conductive types of the first doped region 21a and the second doped region 21b are opposite. For example, the first doped region 21a may be a P-type doped region, and the second doped region 21b may be an N-type doped region. However, the disclosure is not limited thereto. In another embodiment, the first doped region 21a may be an N-type doped region, and the second doped region 21b may be a P-type doped region. Other elements shown in FIG. 1 will be introduced in the following description.

Figure 2A:
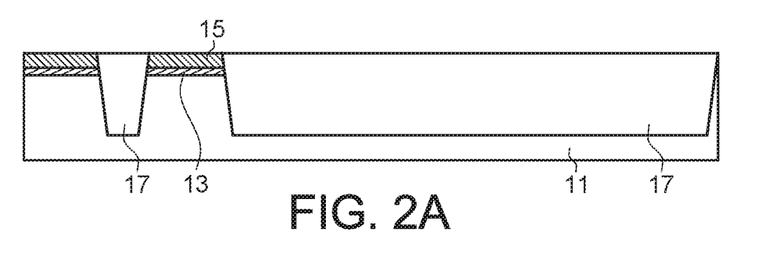

FIG. 2A to FIG. 2M illustrate a process for manufacturing the memory device 100 in one embodiment according to the disclosure. As show in FIG. 2A, a substrate 11 is provided. Then, a pad oxide layer 13 and a silicon nitride layer 15 are sequentially deposited on the substrate 11. An isolation layer 17 is formed in the substrate 11, the pad oxide layer 13 and the silicon nitride layer 15. In this embodiment, the isolation layer 17 may be a shallow trench isolation (STI) or a local oxidation of silicon (LOCOS) isolation.

Figure 2B:
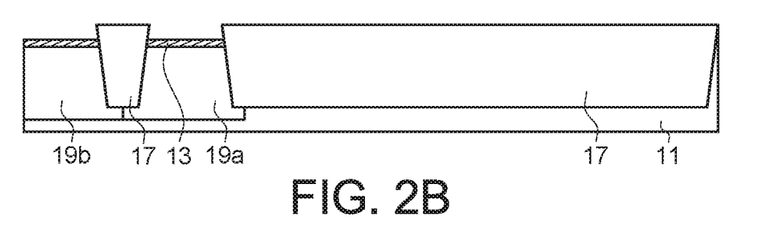

As shown in FIG. 2B, the silicon nitride layer 15 is removed, and a P-well 19a and an N-well 19b are formed in the substrate 11. The N-well 19b may be formed adjacent to the P-well 19a. In this embodiment, the P-well 19a and the N-well 19b may be formed by ion implantation, and a portion of the isolation layer 17 may be disposed between the P-well 19a and the N-well 19b.

Figure 2C:
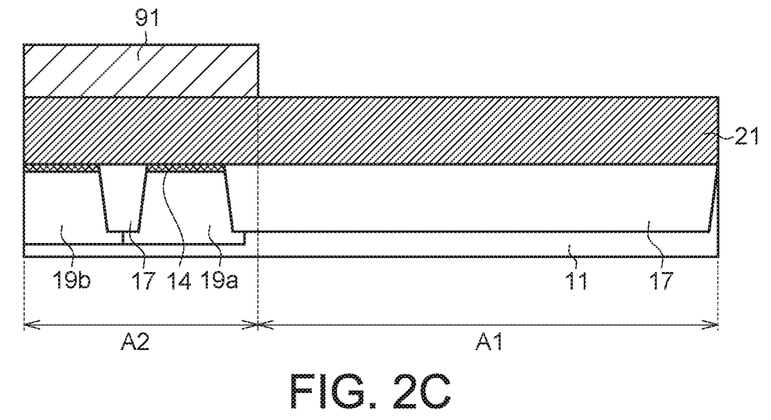

As shown in FIG. 2C, the pad oxide layer 13 is replaced by gate oxide layers 14, and the gate oxide layers 14 are deposited on the P-well 19a and the N-well 19b. Then, a polysilicide layer 21 is deposited on the substrate 11, and a photoresist layer 91 is formed on the polysilicide layer 21 to define an array area A1 and a periphery area A2. That is, the polysilicide layer 21 is formed on the isolation layer 17 in the array area A1, and formed on the gate oxide layer 14 and the isolation layer 17 in the periphery area A2.

Figure 2D:
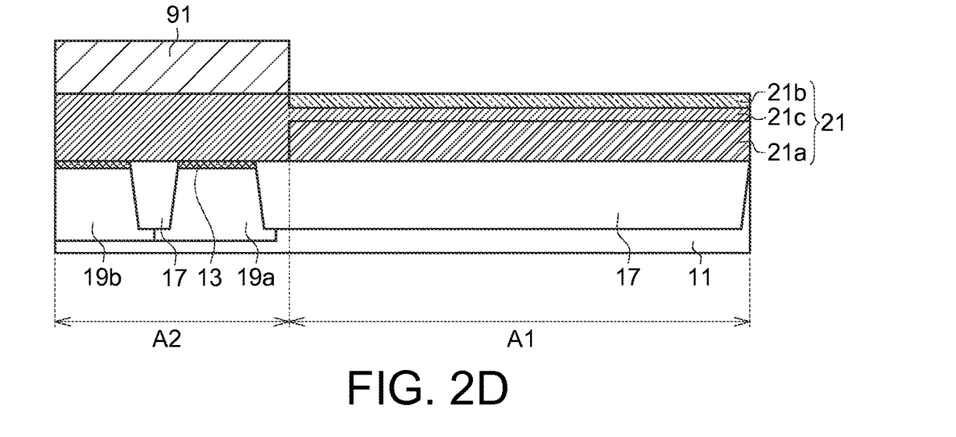

As shown in FIG. 2D, in the array area A1, a first doped region 21a is formed at a bottom portion of the polysilicide layer 21, a second doped region 21b is formed at a top portion of the polysilicide layer 21, and an undoped region 21c is formed between the first doped region 21a and the second doped region 21b. That is, the second doped region 21b is formed on the first doped region 21a, and separated from the first doped region 21a by the undoped region 21c.

Here, the thickness of the first doped region 21a may be between 50 and 1000 Å, and the thickness of the second doped region 21b may be between 50 and 1000 Å. However, the disclosure is not limited thereto. The thickness of the first doped region 21a and the thickness of the second doped region 21b may be determined according to the demand of the memory device.

In one embodiment, the conductive type of the first doped region 21a may be P-type, and the conductive type of the second doped region 21b may be N-type. However, the disclosure is not limited thereto. In another embodiment, the conductive type of the first doped region 21a may be N-type, and the conductive type of the second doped region 21b may be P-type. It depends on the operation of the memory device to determine the conductive types of the first doped region 21a and the second doped region 21b.

In the embodiment of the disclosure, the first doped region 21a, the undoped region 21c, and the second doped region 21b may be used as a vertical diode.

Further, the first doped region 21a and the second doped region 21b may be formed by ion implantation. Since the ion implantation is implemented in the array area A1 and separated from the periphery area A2, it would not impact the elements in the periphery area A2.

Figure 2E:
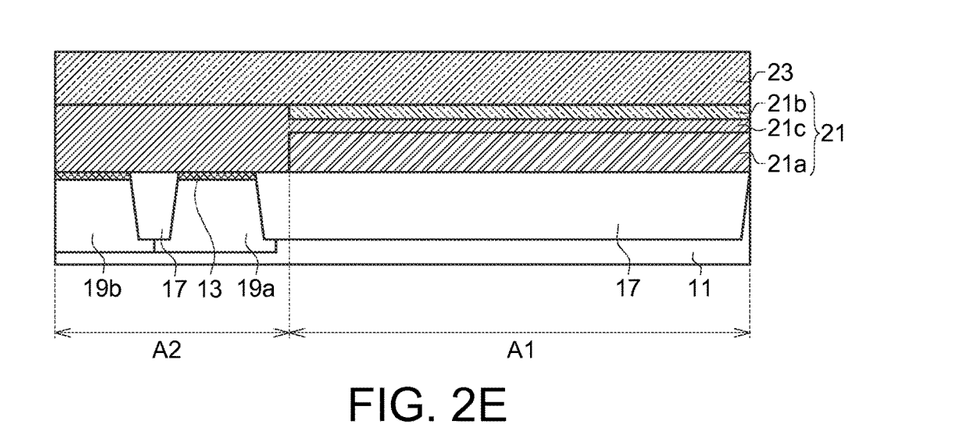

As shown in FIG. 2E, the photoresist layer 91 is removed. Then, a metal silicide layer 23 is formed on the polysilicide layer 21 in the periphery area A2, and on the second doped region 21b of polysilicide layer 21 in the array area A1. In this embodiment, the metal silicide layer 23 may include tungsten silicide, which may reduce the word line resistance.

Figure 2F:
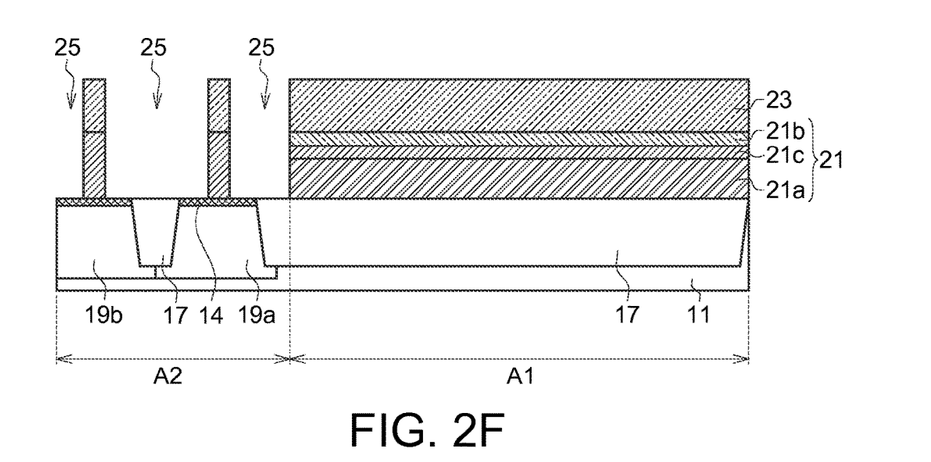

As shown in FIG. 2F, portions of the polysilicide layer 21 and the metal silicide layer 23 are patterned in the periphery area A2 to form a plurality of holes 25, and the etching process is stopped on the top surface of the gate oxide layer 14 and the top surface of the isolation layer 17.

Figure 2G:
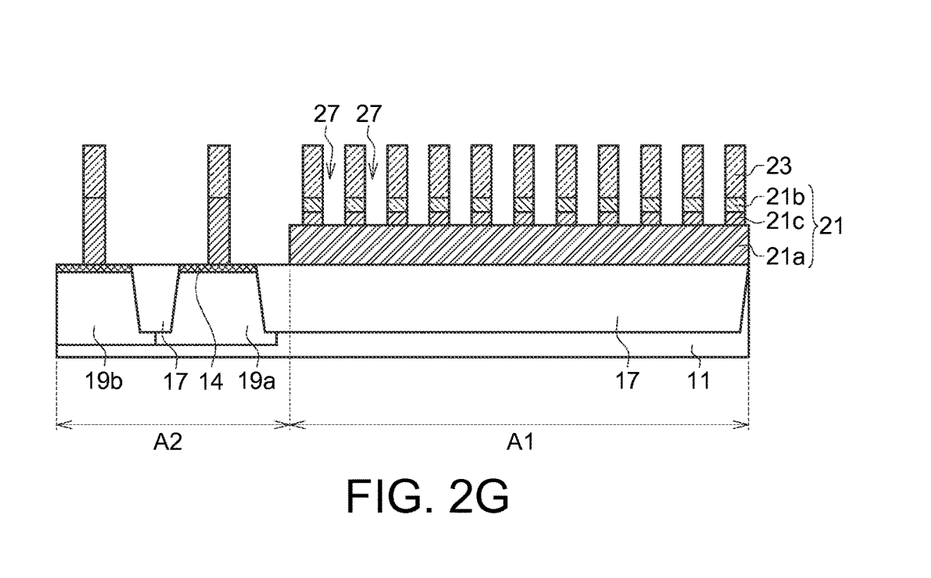

As shown in FIG. 2G, portions of the metal silicide layer 23, the undoped region 21c and the second doped region 21b of the polysilicide layer 21 are patterned in the array area A1 to form a plurality of holes 27, and the etching process is stopped on the top surface of the first doped region 21a of the polysilicide layer 21. In some embodiment, the etching processes in FIG. 2F and FIG. 2G may be implemented at the same time.

Figure 2H:
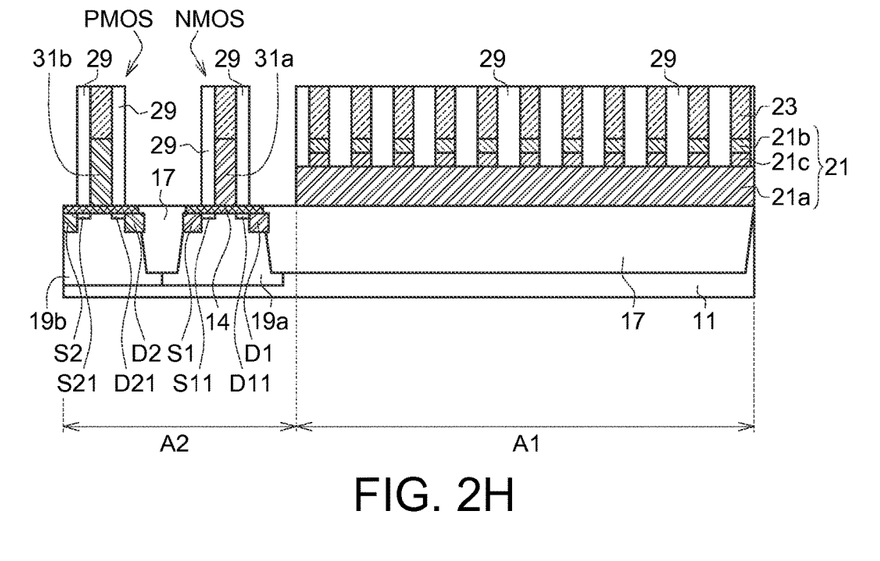

As shown in FIG. 2H, spacers 29 are formed in the holes 25 and 27, and the holes 27 are sealed by the spacers 29. That is, one of the spacers 29 may be formed between two of the metal silicide layers 23 in the array area A1. Then, first electrodes S1 and D1 are formed in the P-well 19a, and second electrodes S2 and D2 are formed in the N-well 19b. In this embodiment, the first electrodes S1 and D1 and the second electrodes S2 and D2 are identical. For example, the first electrodes S1 and D1 and the second electrodes S2 and D2 may be used as sources or drains.

Further, a first doped polysilicide layer 31a is formed on the gate oxide layer 14 on the P-well 19a, and a second doped polysilicide layer 31b is formed on the gate oxide layer 14 on the N-well 19b. In this embodiment, the first doped polysilicide layer 31a is formed by implanting ions into the polysilicide layer 31 on the P-well 19a, and the second doped polysilicide layer 31b is formed by implanting ions into the polysilicide layer 31 on the N-well 19b. That is, metal silicide layers 23 may be formed on the first doped polysilicide layer 31a and the second doped polysilicide layer 31b in the periphery area A2. Therefore, a dual-gate MOSFETs (PMOS and NMOS) may be formed in the periphery area A2.

In some embodiments, a first extension portion S11 may be formed in the P-well 19a and connected with the first electrode S1, a second extension portion D11 may be formed in the P-well 19a and connected with the first electrode D1, a third extension portion S21 may be formed in the N-well 19b and connected with the second electrode S2, and a fourth extension portion D21 may be formed in the N-well 19b and connected with the second electrode D2. Here, the first extension portion S11, the second extension portion D11, the third extension portion S21, and the fourth extension portion D21 may be source/drain extensions or lightly doped drains (LDD).

Figure 2I:
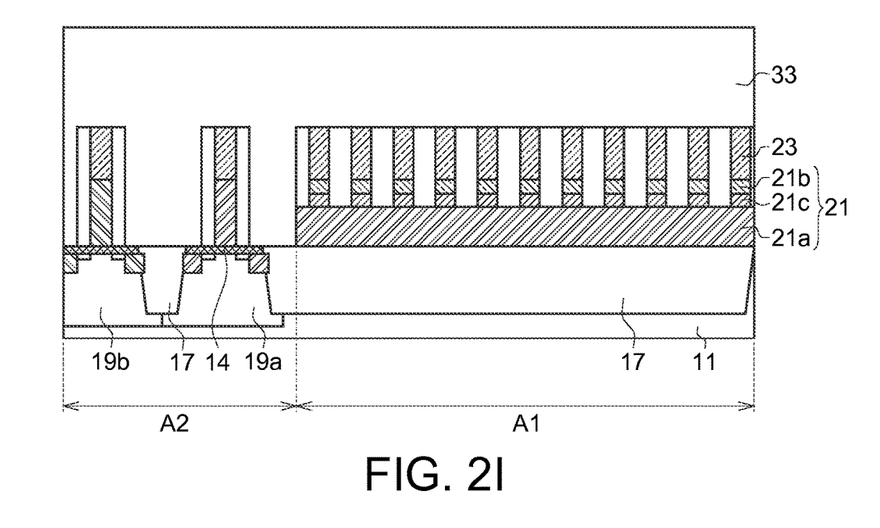

As shown in FIG. 2I, a dielectric layer 33 (inter-layer dielectric, ILD) is formed on the isolation layer 17. In this embodiment, the holes 25 is sealed by the dielectric layer 33 in the periphery area A2, and the dielectric layer 33 may be formed on the surfaces of the spacers 29 and the metal silicide layer 23. Then, a chemical mechanical polishing/planarization (CMP) may be implemented on the dielectric layer 33.

Figure 2J:
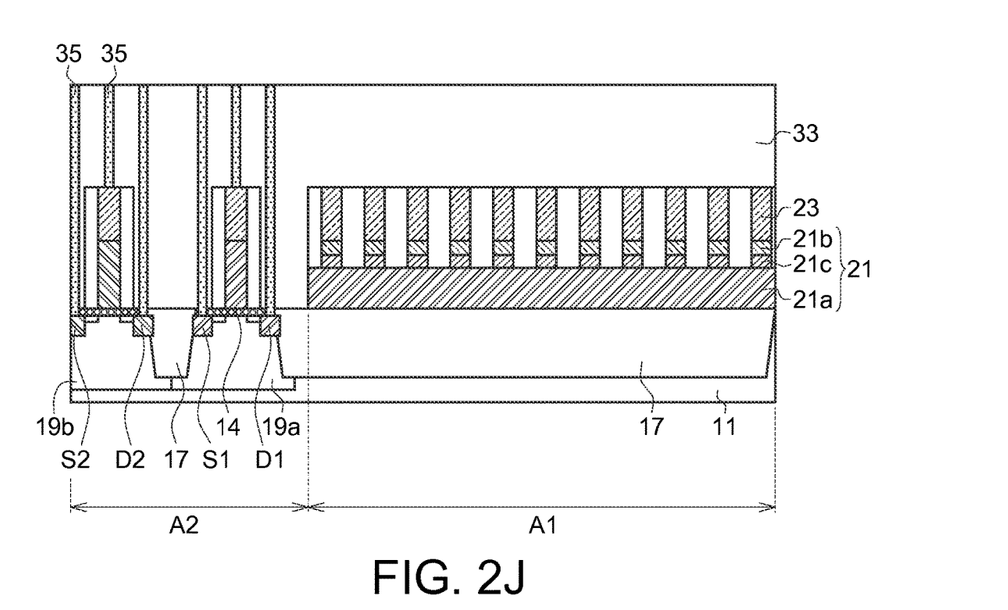

As shown in FIG. 2J, a plurality of first contact plugs 35 is formed and penetrating through the dielectric layer 33 in the periphery area A2. Further, the first contact plugs 35 may be respectively connected with the metal silicide layers 23, the first electrode S1, the second electrode S2, the first electrode D1, and the second electrode D2 in the periphery area A2.

In this embodiment, the first contact plugs 35 may include a CVD TiN layer and tungsten (W). In some embodiments, first contact plugs 35 may further include a PVD Ti layer. Here, the CVD TiN layer may be defined as a layer including titanium nitride and formed by chemical vapor deposition (CVD), and the PVD Ti layer may be defined as a layer including titanium and formed by physical vapor deposition (PVD).

Figure 2K:
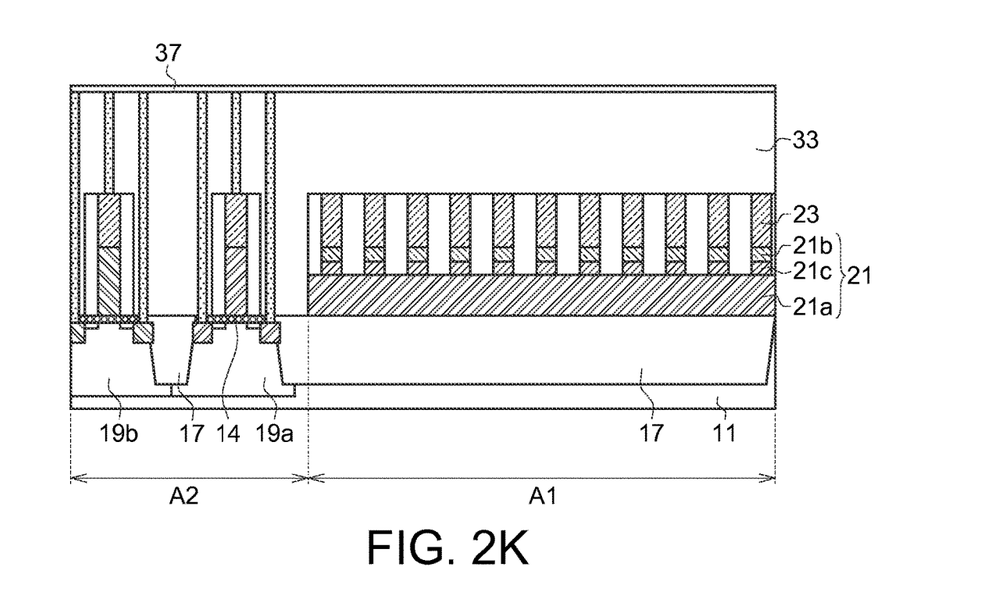

As shown in FIG. 2K, a cap layer 37 is formed on the dielectric layer 33 for protecting the first contact plugs 35 in the periphery area A2. In one embodiment, the cap layer 37 may include silicon nitride (SiN).

Figure 2L:
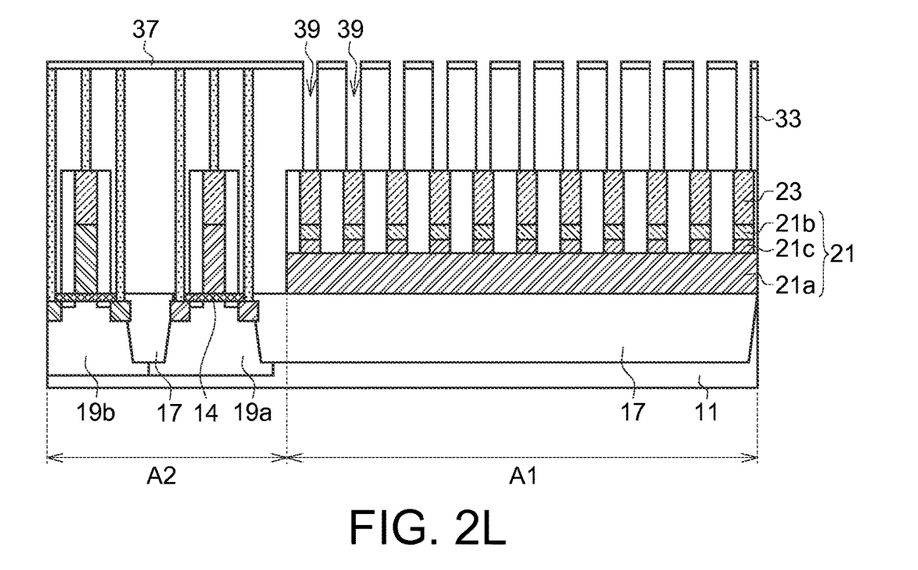

As shown in FIG. 2L, a plurality of through holes 39 are formed in the array area A1. Here, the through holes 39 may be formed by an etching process and expose the top surfaces of metal silicide layer 23 in the array area A1.

Figure 2M:
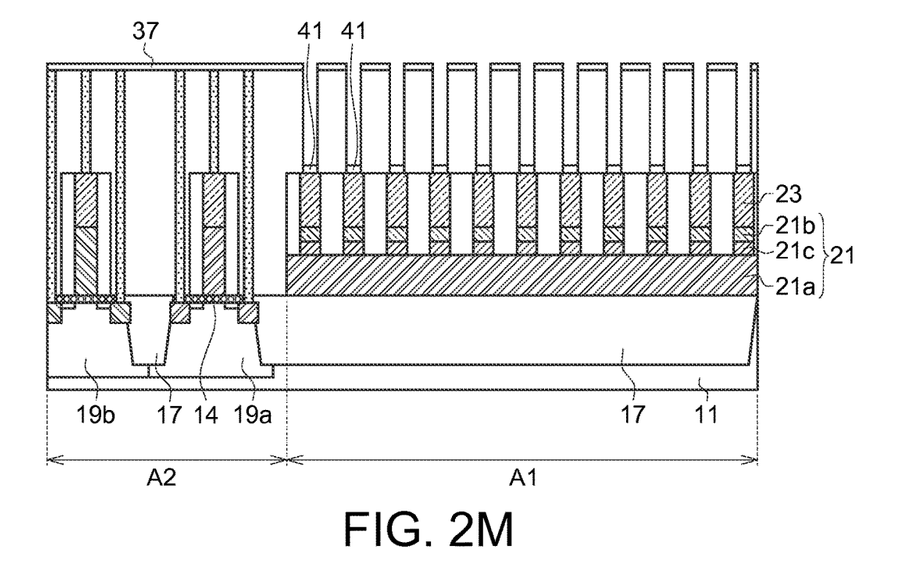

As shown in FIG. 2M, a metal silicide oxide layer 41 is formed on the metal silicide layer 23 in the array area A1. In this embodiment, the metal silicide oxide layer 41 may be formed by a rapid thermal oxidation (RTO) or plasma oxidation. For example, the metal silicide layer 23 may be tungsten silicide layer ($WSi_x$), and a top portion of the tungsten silicide layer may be converted into tungsten silicide oxide layer ($WSi_xO_y$).

Then, a plurality of second contact plugs 43 is formed for sealing the though holes 39 in the array area A1 and the cap layer 37 is removed to form the memory device 100 as shown in FIG. 1. Further, a chemical mechanical polishing/planarization (CMP) may be implemented. In this embodiment, the second contact plugs 43 may be connected with the metal silicide oxide layer 41 in the array area A1.

In this embodiment, the second contact plugs 43 may include a PVD TiN layer, a CVD TiN layer and tungsten. Here, the PVD TiN layer may be defined as a layer including titanium nitride and formed by physical vapor deposition (PVD), and the CVD TiN layer may be defined as a layer including titanium nitride and formed by chemical vapor deposition (CVD).

To deposit TiN layer, chemical vapor deposition utilizes selected precursor which causes C-inserted TiN, while physical vapor deposition uses only Ti and $N_2$ which forms a pure TiN layer. For CVD TiN layer, $H_2$ and $N_2$ plasma treatment is needed to decompose precursor Tetra-dimethyl-amido-titanium (TDMAT) into Ti(C)N and byproducts. The chemical reaction and plasma treatment result in impure TiN which influences the interface of the electrode and the transient film and the quality of metal silicide oxide (e.g. $WSi_xO_y$) layer. On the other hand, the origin of PVD TiN layer contains no extra elements. A strong interface is formed and a well bonded metal silicide oxide (e.g. $WSi_xO_y$) layer is maintained.

Figure 3:
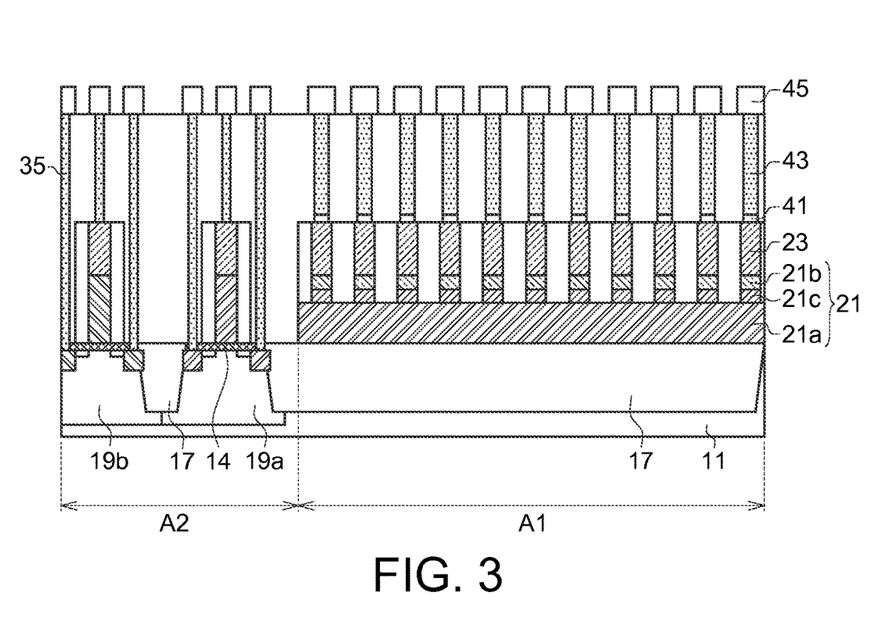
FIG. 3 illustrates a schematic diagram illustrates of the memory device in the following step.

FIG. 3 illustrates a schematic diagram of the memory device 100 in the following step. As shown in FIG. 3, metal lines 45 may be formed for electrically connecting with the first contact plugs 35 and the second contact plugs 43.

Figure 4:
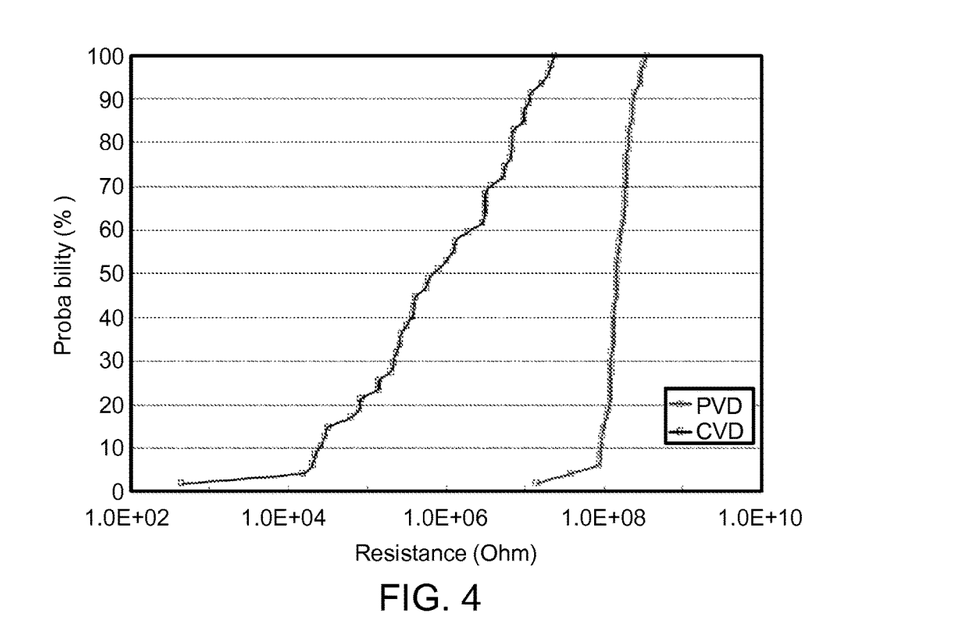
FIG. 4 shows comparison of initial resistance for $WSi_xO_y$ RRAM with top electrode PVD TiN and CVD TiN, respectively.

FIG. 4 shows comparison of initial resistance for $WSi_xO_y$ RRAM with top electrode PVD TiN and CVD TiN, respectively. As shown in FIG. 4, it indicates that there is >1000× improvement by choosing PVD TiN process. In addition, the initial resistance for PVD TiN layer is even higher and these results prove PVD TiN layer can achieve a more robust metal oxide film or a better interface between TiN/$WSi_xO_y$.

Figure 5:
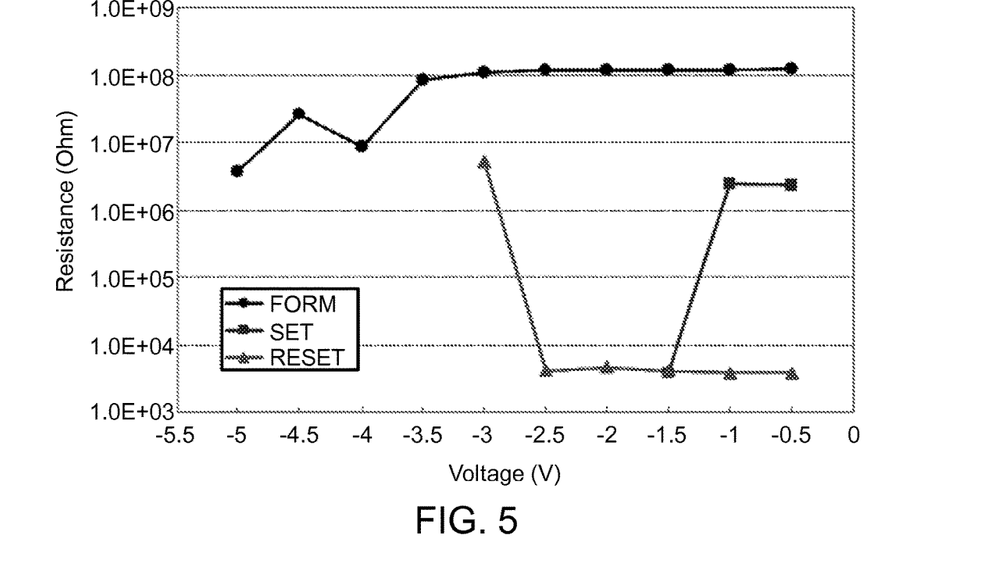
FIG. 5 shows R-V characteristics for unipolar $WSi_xO_y$ RRAM. Negative forming pulses are applied to obtain the first forming operation.

FIG. 5 shows R-V characteristics for unipolar $WSi_xO_y$ RRAM. Negative forming pulses are applied to obtain the first forming operation. A higher operation voltage is required for forming operation than for RESET and SET within 50 ns pulse width. In the beginning, the fresh device requires a large voltage to create conductive paths from top to bottom. While the followed RESET and SET processes rupture and regenerate local regions of filaments, respectively. It is expected the forming process requires larger voltage than RESET/SET switching behaviors. After forming, the W-silicide RRAM can be switched in unipolar mode with negative pulses for both SET and RESET. The operation voltages less than 3V for both RESET and SET are demonstrated with resistance switching window >100×.

Figure 6:
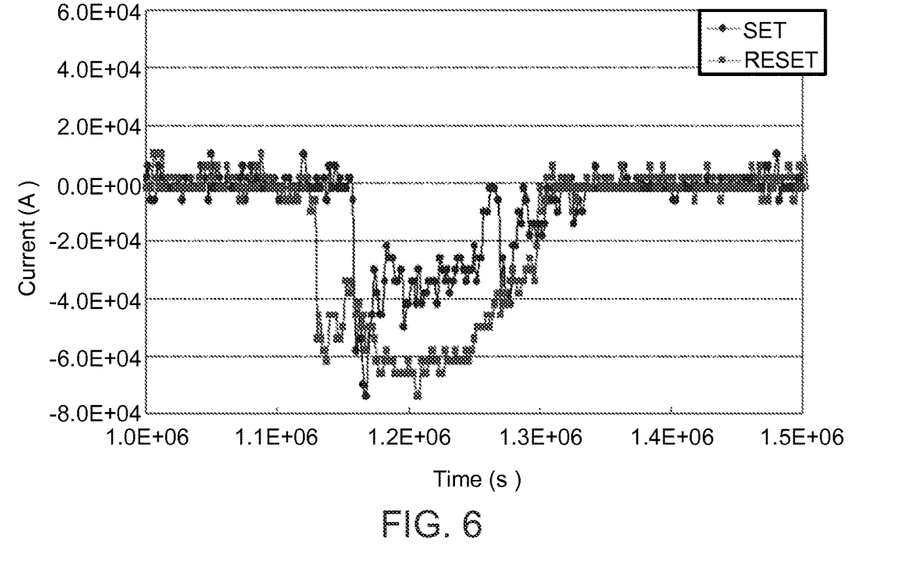
FIG. 6 shows transient I-t curves by applying SET/RESET pulse to unipolar W RRAM device.

FIG. 6 shows transient I-t curves by applying SET/RESET pulse to unipolar W RRAM device. The transient I-t curves from oscilloscope shows that W-silicide RRAM device is well switched at pulse time 50 ns. The SET and RESET current are 400 µA and 700 µA, respectively, to achieve SET (~100 Kohms) to RESET (~1 Mohms) resistance window.

Figure 7:
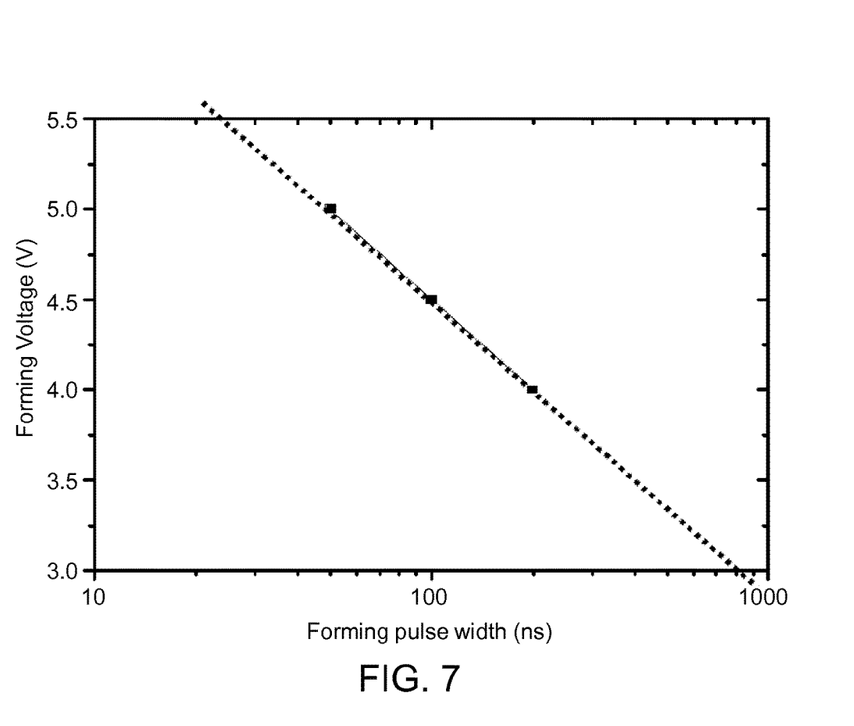
FIG. 7 shows forming voltage as a function of forming pulse width for unipolar $WSi_xO_y$ RRAM.

FIG. 7 shows forming voltage as a function of forming pulse width for unipolar $WSi_xO_y$ RRAM. FIG. 7 indicates a decreased trend of forming voltage as forming pulse width increases. Forming operation is only applied once so longer forming pulse width didn't impact major device operation speed. The 1 µs forming pulse width can reduce forming voltage to <3V as a forming free like operation.

Figure 8:
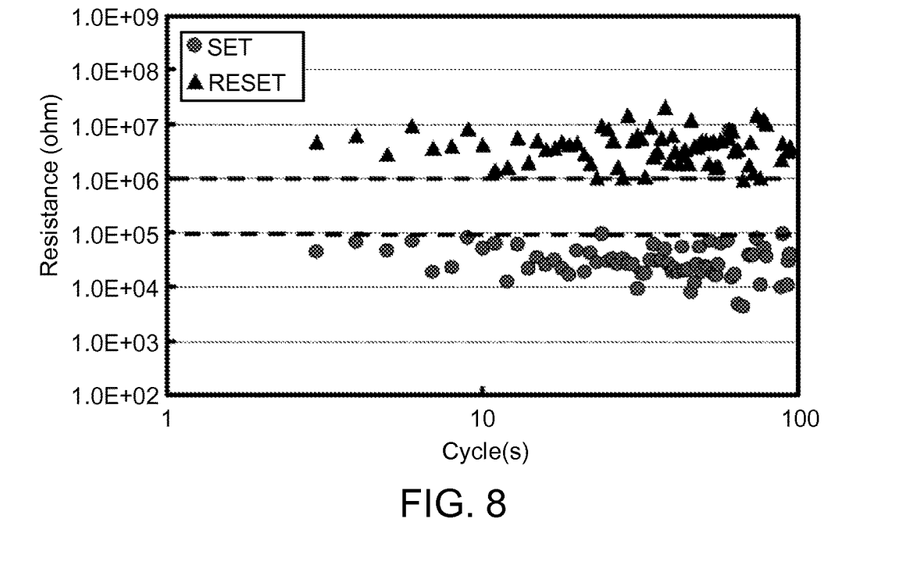
FIG. 8 shows the unipolar $WSi_xO_y$ RRAM cycling characteristic.

FIG. 8 shows the unipolar $WSi_xO_y$ RRAM cycling characteristic. As shown in FIG. 8, it indicates that the cycling endurance >100 can be demonstrated with a ~10× resistance window (optimizing the switching window 100 KΩ-1 MΩ).

Figure 9:
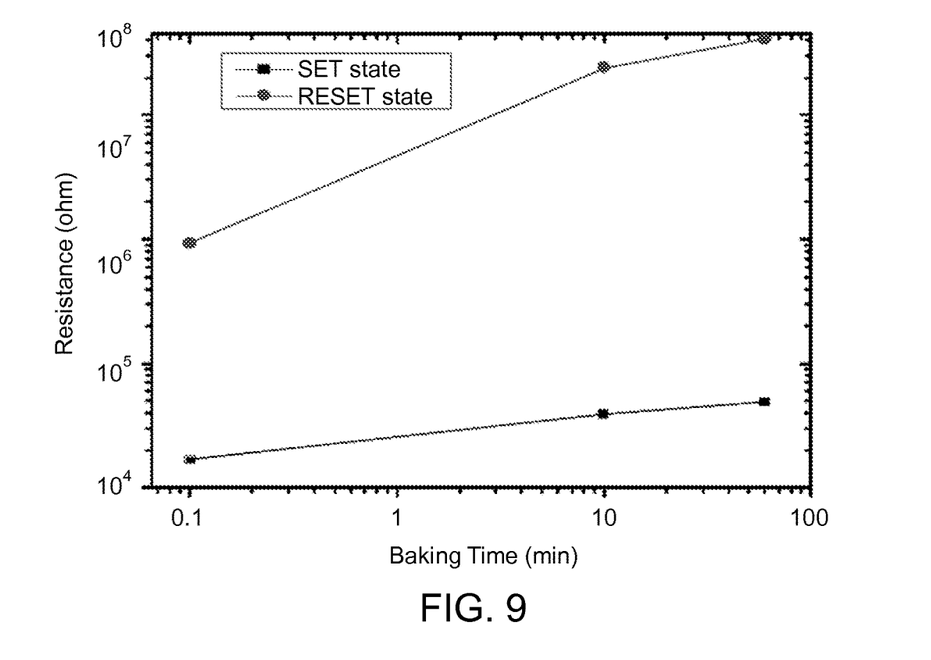
FIG. 9 shows data retention for RESET and SET states at 250° C. for 1 hr.

FIG. 9 shows data retention for RESET and SET states at 250° C. for 1 hr. FIG. 9 indicates that good sensing window can be maintained after higher temperature baking for proving good data retention for RRAM device.

According to the embodiments of the disclosure mentioned above, a unipolar metal silicide oxide (e.g. $WSi_xO_y$) RRAM device has been proposed and fabricated for the first time. Dramatically improvement on initial resistance by PVD-TiN provides a new direction to optimize device performance. Good unipolar performances are demonstrated with fast switch speed, good data retention and 10× switching window.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device having an array area and a periphery area, comprising:
   a substrate;
   an isolation layer formed in the substrate;
   a first doped region formed on the isolation layer in the array area;
   a second doped region formed on the first doped region;
   a first metal silicide layer formed on the second doped region;
   a metal silicide oxide layer formed on the first metal silicide layer;
   a P-well formed in the substrate in the periphery area;
   a N-well formed adjacent to the P-well in the periphery area;
   two first electrodes formed in the P-well;
   a first gate oxide layer formed on the P-well;
   two second electrodes formed in the N-well;
   a second gate oxide layer formed on the N-well;
   a first doped polysilicide layer formed on the first gate oxide layer;
   a second doped polysilicide layer formed on the second gate oxide layer; and
   a plurality of second metal silicide layers formed on the first doped polysilicide layer and the second doped polysilicide layer;
   wherein portions of the isolation layer is formed between the P-well and the N-well.

2. The memory device according to claim 1, further comprising:
   a plurality of first metal silicide layers; and
   a spacer formed between two of the first metal silicide layers.

3. The memory device according to claim 1, further comprising:

an undoped region formed between the first doped region and the second doped region.

4. The memory device according to claim 1, further comprising:
a first extension portion connected with one of the first electrodes;
a second extension portion connected with another one of the first electrodes,
a third extension portion connected with one of the second electrodes; and
a fourth extension portion connected with another one of the second electrodes.

5. The memory device according to claim 1, further comprising:
a plurality of first contact plugs respectively connected with the second metal silicide layers, the first electrodes, and the second electrodes in the periphery area.

6. The memory device according to claim 5, wherein the first contact plugs comprises a CVD TiN layer and tungsten.

7. The memory device according to claim 1, further comprising:
a second contact plug connected with the metal silicide oxide layer in the array area.

8. The memory device according to claim 7, wherein the second contact plug comprises a PVD TiN layer, a CVD TiN layer and tungsten.

9. The memory device according to claim 1, further comprising:
a dielectric layer formed on the isolation layer.

10. The memory device according to claim 1, wherein the isolation layer is a shallow trench isolation or a local oxidation of silicon isolation.

11. The memory device according to claim 1, wherein a thickness of the first doped region is between 50 and 1000 Å, and a thickness of the second doped region is between 50 and 1000 Å.

* * * * *